(12) United States Patent
Gwon et al.

(10) Patent No.: US 11,195,888 B2
(45) Date of Patent: Dec. 7, 2021

(54) DISPLAY DEVICE

(71) Applicant: LG Display Co., Ltd., Seoul (KR)

(72) Inventors: Hyang-Myoung Gwon, Paju-si (KR); Ru-Da Rhe, Seoul (KR); Ji-Hyun Jung, Paju-si (KR); Su-Chang An, Seoul (KR); Sang-Kyu Kim, Goyang-si (KR); Jae-Gyun Lee, Paju-si (KR); Yoonnara Jang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/904,525

(22) Filed: Jun. 17, 2020

(65) Prior Publication Data

US 2020/0411598 A1  Dec. 31, 2020

(30) Foreign Application Priority Data

Jun. 28, 2019  (KR) .................. 10-2019-0077792

(51) Int. Cl.
*G06F 3/045* (2006.01)
*H01L 27/32* (2006.01)
(Continued)

(52) U.S. Cl.
CPC .......... *H01L 27/323* (2013.01); *G06F 3/0412* (2013.01); *G06F 3/0443* (2019.05); *H01L 27/3276* (2013.01); *H01L 51/5206* (2013.01); *H01L 51/5253* (2013.01); *G06F 2203/04102* (2013.01); *H01L 27/322* (2013.01); *H01L 51/0097* (2013.01)

(58) Field of Classification Search
CPC ......... G06F 2203/04102; G06F 3/0412; G06F 3/04164; G06F 3/0443; H01L 27/322; H01L 27/323; H01L 27/3276; H01L 51/0097; H01L 51/5206; H01L 51/5253
See application file for complete search history.

(56) References Cited

U.S. PATENT DOCUMENTS

| | | | |
|---|---|---|---|
| 10,180,745 B2 | 1/2019 | Shao et al. | |
| 2017/0371465 A1* | 12/2017 | Ahn | ................. G06F 3/041 |
| 2018/0151662 A1* | 5/2018 | Rhe | ................. G06F 3/0412 |

FOREIGN PATENT DOCUMENTS

| | | |
|---|---|---|
| CN | 106959783 A | 7/2017 |
| CN | 107479283 A | 12/2017 |

(Continued)

OTHER PUBLICATIONS

European Patent Office, Extended European Search Report and Opinion, EP Patent Application No. 20182272.3, dated Oct. 13, 2020, ten pages.

*Primary Examiner* — Insa Sadio
(74) *Attorney, Agent, or Firm* — Fenwick & West LLP

(57) ABSTRACT

Disclosed is a display device having a reduced bezel area. The display device includes a plurality of touch lines electrically connected to a plurality of touch electrodes and display link lines electrically connected to a light-emitting element, the display link lines being disposed in a non-active area of a substrate, wherein a minimum of M touch lines (M being a natural number greater than 1 and less than N) is disposed with respect to a minimum of N display link lines (N being a natural number greater than 1), among the plurality of display link lines, in the non-active area. Consequently, a narrow bezel may be realized.

18 Claims, 8 Drawing Sheets

(51) Int. Cl.
  *G06F 3/044*   (2006.01)
  *G06F 3/041*   (2006.01)
  *H01L 51/52*   (2006.01)
  *H01L 51/00*   (2006.01)

(56) References Cited

FOREIGN PATENT DOCUMENTS

| CN | 108649038 A | 10/2018 |
|---|---|---|
| EP | 3477442 A2 | 5/2019 |
| KR | 10-2018-0078571 A | 7/2018 |

\* cited by examiner

DISPLAY DEVICE

CROSS-REFERENCE TO RELATED APPLICATIONS

This application claims the benefit of Republic of Korea Patent Application No. 10-2019-0077792, filed on Jun. 28, 2019, which is hereby incorporated by reference as if fully set forth herein.

BACKGROUND

Field

The present disclosure relates to a display device, and more particularly to a display device having a reduced bezel area.

Discussion of the Related Art

A touchscreen is an input device that allows a user to input a command by selecting one of instructions displayed on a screen, such as that of a display device, using a user's hand or an object. That is, the touchscreen converts the contact position, at which the user's hand or the object directly contacts the touchscreen, into an electrical signal to receive the instruction selected at the contact position as an input signal. Use of the touchscreen has increased, since the touchscreen is capable of replacing a separate input device that is connected to the display device for operation, such as a keyboard or a mouse.

In recent years, research has been actively conducted on an integrated display device in which the touchscreen is disposed on a display panel, such as a liquid crystal display panel or an organic electroluminescent display panel. Touch lines configured to drive the touchscreen and display lines configured to drive the display panel are disposed in a bezel area, which is a non-display area, of the integrated display device, whereby it is difficult to reduce the width of the bezel area. In particular, a self-capacitance touchscreen has a larger number of touch lines than a capacitive touchscreen, whereby an integrated display device including a self-capacitance touchscreen has a problem in that the space of the bezel area in which display link lines connected to the display lines and the touch lines are disposed is insufficient.

Furthermore, a signal transmission film attached to the bezel area has a smaller length than the bezel area. In this case, the distance between signal pads electrically connected to the signal transmission film is less than the distance between the display link lines and the touch lines, whereby electrical short circuit occurs between the signal pads.

SUMMARY

Accordingly, the present disclosure is directed to a display device that substantially obviates one or more problems due to limitations and disadvantages of the related art.

An object of the present invention is to provide a display device having a reduced bezel area without electrical short circuit between signal pads.

Additional advantages, objects, and features of the invention will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a plurality of touch lines electrically connected to a plurality of touch electrodes disposed on an encapsulation unit and display link lines electrically connected to a light-emitting element, the display link lines being disposed in a non-active area of a substrate, wherein a minimum of M touch lines (M being a natural number greater than 1 and less than N) is disposed with respect to a minimum of N display link lines (N being a natural number greater than 1), among the plurality of display link lines, in the non-active area, whereby a narrow bezel may be realized.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, embodiments of the present disclosure will be described in detail with reference to the accompanying drawings.

Figure 1:
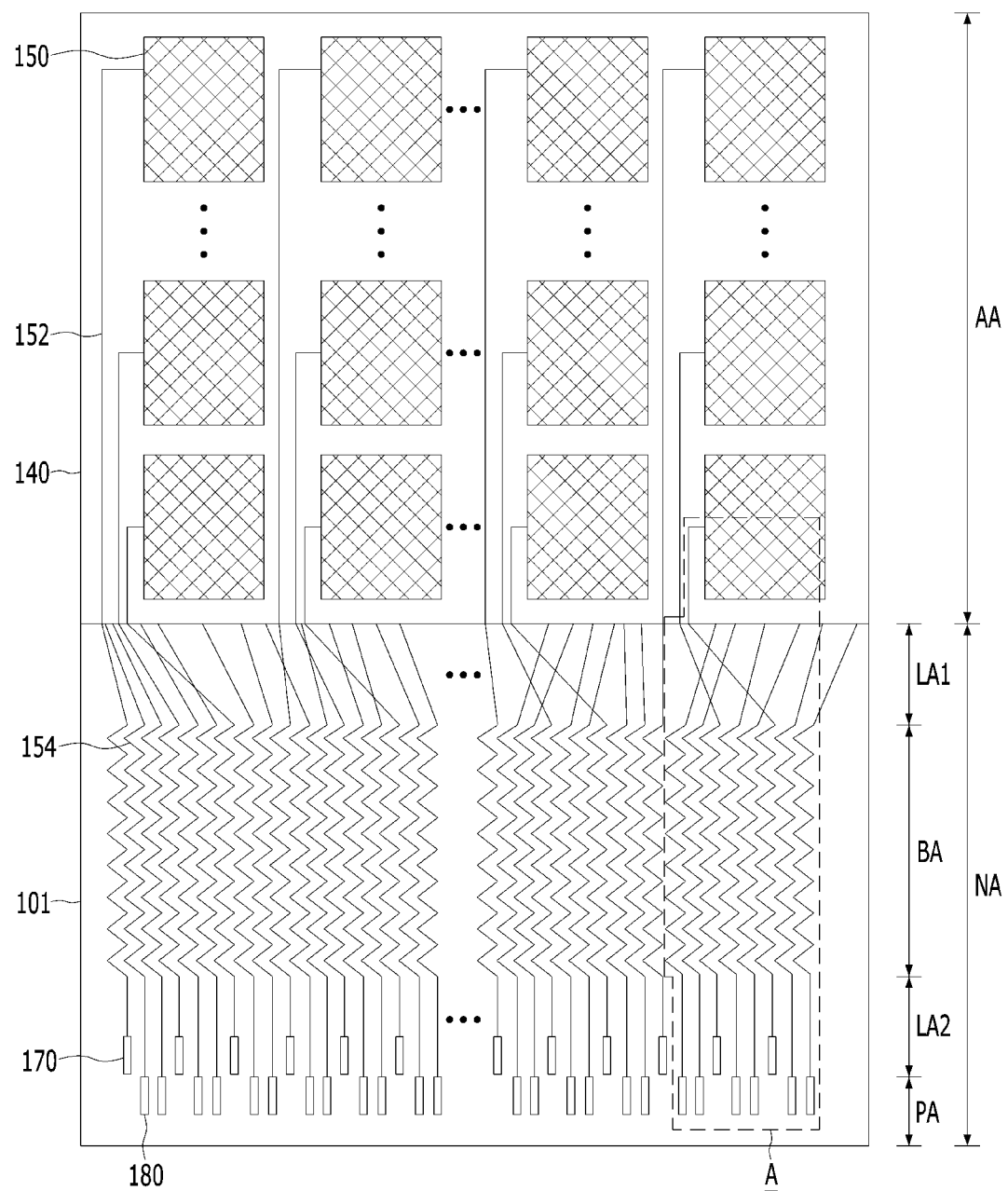
FIG. 1 is a plan view showing a display device according to a first embodiment of the present disclosure.

FIG. 1 is a plan view showing a display device according to a first embodiment of the present disclosure.

The display device shown in FIG. 1 is divided into an active area AA and a non-active area NA provided on a substrate 101.

A plurality of display elements and a plurality of touch electrodes 150 are disposed in the active area AA. Each of the plurality of touch electrodes 150 includes capacitance formed therein and thus is used as a self-capacitance touch sensor configured to sense a change in capacitance due to user touch. In a self-capacitance sensing method using such a touch electrode 150, electric charge is accumulated in a touch sensor when a drive signal supplied through a touch line 152 is applied to the touch electrode 150. At this time, when a user's finger or a conductive object contacts the touch electrode 150, parasitic capacitance is additionally connected to a self-capacitance sensor, whereby the value of capacitance is changed. Consequently, the value of capacitance of the touch sensor touched by the finger is different from the value of capacitance of a touch sensor not touched by the finger, whereby it is possible to determine whether touch has been performed.

The plurality of touch electrodes 150 may be formed so as to have the same or similar size. Consequently, a deviation in touch sensitivity of the plurality of touch electrodes 150 is minimized or reduced, whereby it is possible to reduce noise. The touch electrodes 150 are connected to touch lines 152 in the active area AA.

The non-active area NA is disposed in the vicinity of the active area AA. For example, the non-active area NA is disposed at at least one of the upper side, lower side, the left side, or the right side of the active area AA.

The non-active area NA includes first and second link areas LA1 and LA2, a bending area BA, and a pad area PA.

The first link area LA1 is disposed between the active area AA and the bending area BA.

The second link area LA2 is disposed between the bending area BA and the pad area PA. Lighting inspection transistors are disposed in the second link area LA2.

Figure 2:
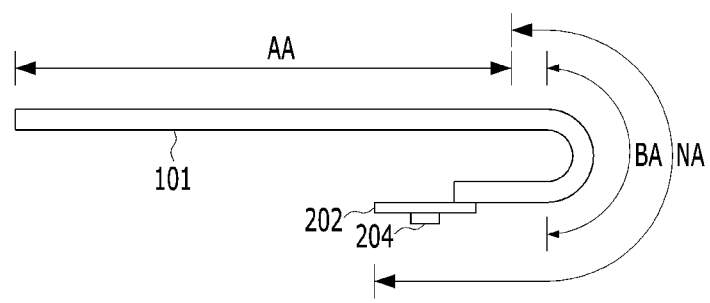
FIG. 2 is a sectional view showing the state in which the display device shown in FIG. 1 is bent according to an embodiment of the present disclosure.

The bending area BA is an area in which the substrate 101 is bendable or foldable, as shown in FIG. 2, and corresponds to an area that is bent in order to locate the non-active area NA at the rear of the active area AA. In the entire screen of the display device, the area occupied by the active area AA is maximized or increased and the area corresponding to the non-active area NA is minimized or decreased by the bending area BA. The bending area BA may be disposed in at least one of the upper side, the lower side, the left side, or the right side of the non-active area NA.

Display link lines 154 connected to the display elements and touch lines 152 connected to the touch electrodes 150 are disposed in the first and second link areas LA1 and LA2 and the bending area BA. In the bending area BA, each of the touch lines 152 and the display link lines 154 is disposed in a zigzag fashion, or a plurality of hollow polygonal structures, a plurality of hollow circular structures, or combinations thereof are connected to each other and disposed in a line. Consequently, it is possible to reduce damage to the touch lines 152 and the display link lines 154 even when bending force is applied to the bending area BA.

Display pads 180 connected to the plurality of display link lines 154 and touch pads 170 connected to the plurality of touch lines 152 are disposed in the pad area PA. As shown in FIG. 2, the display pads 180 and the touch pads 170 are electrically connected to a signal transmission film 202 on which a drive integrated circuit 204 is mounted. Here, the drive integrated circuit 204 may be realized by an integrated touch display drive IC (TDDI) in which a display drive circuit configured to drive the display elements and a touch drive circuit configured to drive the touch electrodes 150 are integrated.

A liquid crystal element or a light-emitting element may be applied as each of the display elements included in the display device having the active area AA and the non-active area NA. Particularly, in the present disclosure, a display device in which a light-emitting element shown in FIGS. 3 and 4 is applied as a display element will be described by way of example.

Figure 3:
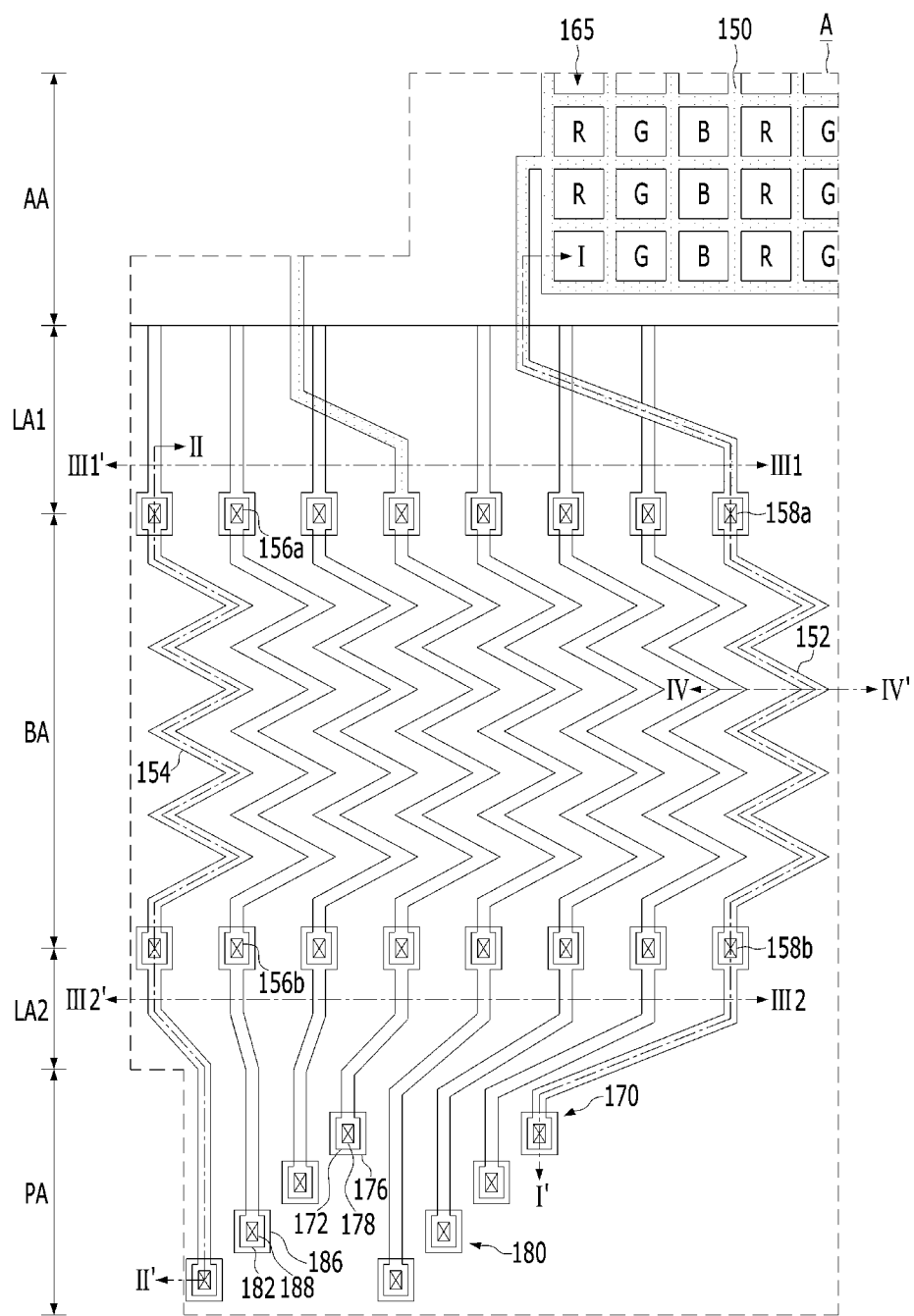
FIG. 3 is an enlarged plan view of area A of FIG. 1 according to an embodiment of the present disclosure.
Figure 4:
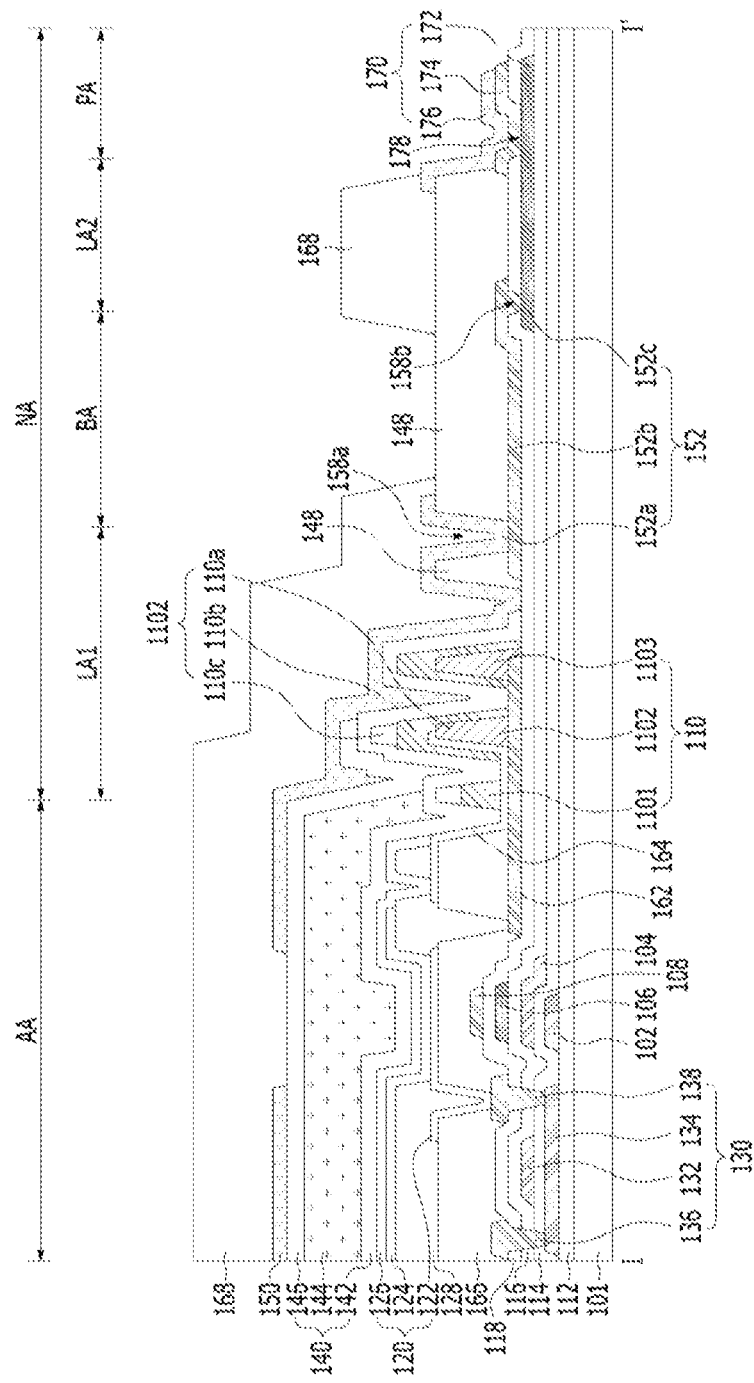
FIG. 4 is a sectional view of the display device taken along line I-I' of FIG. 3 according to an embodiment of the present disclosure.

An organic light-emitting display device having a touch sensor shown in FIGS. 3 and 4 includes a substrate 101, a plurality of subpixels disposed on the substrate 101 in a matrix form, an encapsulation unit 140 disposed on the plurality of subpixels, and a touch electrode 150 disposed on the encapsulation unit 140.

The substrate 101 is made of a plastic material or a glass material having flexibility so as to be foldable or bendable. For example, the substrate 101 may be made of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

The plurality of subpixels includes red (R), green (G), and blue (B) subpixels or red (R), green (G), blue (B), and white (W) subpixels. Each of the plurality of subpixels includes a pixel drive circuit and a light-emitting element 120 connected to the pixel drive circuit.

Figure 5:
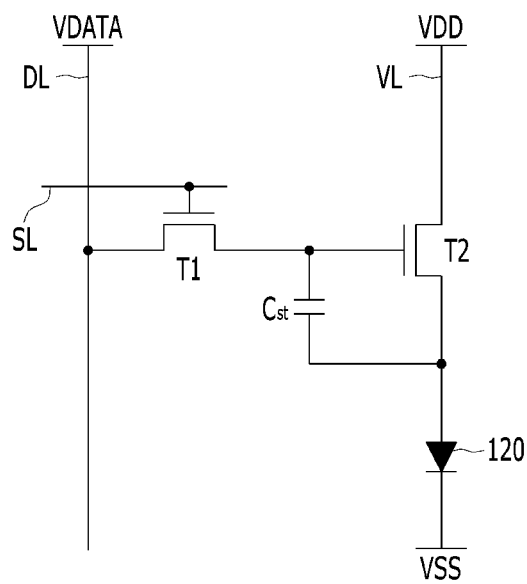
FIG. 5 is a circuit diagram showing each subpixel shown in FIG. 3, according to an embodiment of the present disclosure.

As shown in FIG. 5, the pixel drive circuit includes a switching transistor T1, a drive transistor T2, and a storage capacitor Cst. In the present disclosure, the pixel drive circuit has been described as including two transistors T and one capacitor C by way of example. However, the present disclosure is not limited thereto. That is, a 3T1C or 3T2C type pixel drive circuit having three or more transistors T and one or more capacitors C may be used.

When a scan pulse is supplied to a scan line SL, the switching transistor T1 is turned on to supply a data signal Vdata, which has been supplied to a data line DL, to the storage capacitor Cst and to a gate electrode of the drive transistor T2.

In response to the data signal supplied to the gate electrode of the drive transistor T2, the drive transistor T2 controls current that is supplied from a high-voltage (VDD) supply line to the light-emitting element 120 to adjust the amount of light emitted by the light-emitting element 120. Even when the switching transistor T1 is turned off, the drive transistor T2 supplies uniform current to the light-emitting element 120 using voltage charged in the storage capacitor Cst such that the light-emitting element 120 keeps emitting light until a data signal of the next frame is supplied.

To this end, as shown in FIG. 4, the drive transistor 130 includes a semiconductor layer 134 disposed on a buffer layer 112, a gate electrode 132 overlapping the semiconductor layer 134 in the state in which a gate dielectric film 114 is disposed therebetween, and source and drain electrodes 136 and 138 formed on an upper interlayer dielectric film 118 so as to contact the semiconductor layer 134.

The semiconductor layer 134 is made of at least one of an amorphous semiconductor material, a polycrystalline semiconductor material, or an oxide semiconductor material. The semiconductor layer 134 includes a channel area, a source area, and a drain area. The channel area overlaps the gate electrode 132 in the state in which the gate dielectric film 114 is disposed therebetween so as to be formed between the source and drain electrodes 136 and 138. The source area is electrically connected to the source electrode 136 via a source contact hole, which is formed through the gate dielectric film 114 and interlayer dielectric films 116 and 118. The drain area is electrically connected to the drain electrode 138 via a drain contact hole, which is formed through the gate dielectric film 114 and the interlayer dielectric films 116 and 118.

The buffer layer 112, which is disposed between the semiconductor layer 134 and the substrate 101, blocks moisture and/or oxygen that has permeated into the substrate 101 to protect the semiconductor layer 134. The buffer layer 112 is made of at least one of SiNx or SiOx, and has an at least single-layered structure.

The gate electrode 132 may be made of one of molybdenum (Mo), aluminum (Al), chromium (Cr), gold (Au), titanium (Ti), nickel (Ni), neodymium (Nd), and copper (Cu) or an alloy thereof, and may have a single-layered structure or a multi-layered structure. However, the present disclosure is not limited thereto. The gate electrode 132 overlaps the channel area of the semiconductor layer 134 in the state in which the gate dielectric film 114 is disposed therebetween.

Each of the source and drain electrodes 136 and 138 may be made of one of molybdenum (Mo), aluminum (Al), chromium (Cr), gold (Au), titanium (Ti), nickel (Ni), neodymium (Nd), and copper (Cu) or an alloy thereof, and may have a single-layered structure or a multi-layered structure. However, the present disclosure is not limited thereto. The source electrode 136 is connected to the source area of the semiconductor layer 134 exposed through the source contact hole, which is formed through the gate dielectric film 114 and the lower and upper interlayer dielectric films 116 and 118. The drain electrode 138 faces the source electrode 136, and is connected to the drain area of the semiconductor layer 134 via the drain contact hole, which is formed through the gate dielectric film 114 and the lower and upper interlayer dielectric films 116 and 118.

As shown in FIG. 4, the storage capacitor Cst includes at least two of first to fourth storage electrodes 102, 104, 106, and 108. The first storage electrode 102 is formed on the buffer layer 112, and is made of the same material as the semiconductor layer 134. The second storage electrode 104 is formed on the gate dielectric film 114, and is made of the same material as the gate electrode 132. The third storage electrode 106 is formed on the lower interlayer dielectric film 116, and is made of the same material as a third touch line 152c. The fourth storage electrode 108 is formed on the upper interlayer dielectric film 118, and is made of the same material as the source and drain electrodes 136 and 138.

The light-emitting element 120 includes an anode 122, at least one light-emitting stack 124 formed on the anode 122, and a cathode 126 formed on the light-emitting stack 124.

The anode 122 is electrically connected to a drain electrode 138 of a drive transistor 130, which is exposed through a pixel contact hole formed through a pixel planarization layer 166.

The at least one light-emitting stack 124 is formed on an anode 122 in a light-emitting area defined by a bank 128. The at least one light-emitting stack 124 is formed by stacking a hole-related layer, an organic light-emitting layer, and an electron-related layer on the anode 122 in that order or in reverse order. In addition, the light-emitting stack 124 may include first and second light-emitting stacks that are opposite each other in the state in which a charge generation layer is disposed therebetween. In this case, the organic light-emitting layer of one of the first and second light-emitting stacks generates blue light, and the organic light-emitting layer of the other of the first and second light-emitting stacks generates yellowish-green light. Consequently, white light is generated by the first and second light-emitting stacks. The white light generated by the light-emitting stack 124 is incident on a color filter, which is located above or under the light-emitting stack 124, to realize a color image.

Alternatively, each light-emitting stack 124 may generate colored light corresponding to each subpixel without a separate color filter in order to realize a color image. That is, the light-emitting stack 124 of the red subpixel may generate red light, the light-emitting stack 124 of the green subpixel may generate green light, and the light-emitting stack 124 of the blue subpixel may generate blue light.

The cathode 126 is formed so as to be opposite the anode 122 in the state in which the light-emitting stack 124 is disposed therebetween. The cathode 126 is connected to a low-voltage (VSS) supply line via first and second auxiliary electrodes 162 and 164. The first auxiliary electrode 162 is made of the same material as the source and drain electrodes 136 and 138, and is disposed on the upper interlayer dielectric film 118. The first auxiliary electrode 162 is disposed on the upper interlayer dielectric film 118 so as to overlap at least one of a plurality of dams 110.

The second auxiliary electrode 164 is made of the same material as the anode 132, and is disposed on the pixel planarization layer 166. The second auxiliary electrode 164 is connected to the first auxiliary electrode 162 exposed between the pixel planarization layer 166 disposed at the outermost side and a first sub dam layer 110a of a second dam 1102. In this case, the second auxiliary electrode 164 is formed so as to extend along the upper surface and the side surface of the pixel planarization layer 166 disposed at the outermost side, the upper surface of the first auxiliary electrode 162, and the side surface of the first sub dam layer 110a of the second dam 1102. In addition, the second auxiliary electrode 164 exposed between the banks 128 is connected to the cathode 126 on the pixel planarization layer 166.

The encapsulation unit 140 prevents external moisture or oxygen from permeating into the light-emitting element 120, which has low resistance to external moisture or oxygen. To this end, the encapsulation unit 140 includes at least one inorganic encapsulation layer 142 and at least one organic encapsulation layer 144. In the present disclosure, an encapsulation unit 140 having a structure in which a first inorganic encapsulation layer 142, an organic encapsulation layer 144, and a second inorganic encapsulation layer 146 are sequentially stacked will be described by way of example.

The first inorganic encapsulation layer 142 is formed on the substrate 101 on which the cathode 126 is formed. The second inorganic encapsulation layer 146 is formed on the substrate 101 on which the organic encapsulation layer 144 is formed, and is formed so as to surround the upper surface, the lower surface, and the side surface of the organic encapsulation layer 144 together with the first inorganic encapsulation layer 142.

The first and second inorganic encapsulation layers 142 and 146 minimize or prevent external moisture or oxygen from permeating into the light-emitting stack 124. Each of the first and second inorganic encapsulation layers 142 and 146 is made of an inorganic dielectric material that can be deposited at a low temperature, such as silicon nitride ($SiN_x$), silicon oxide ($SiO_x$), silicon oxynitride (SiON), or aluminum oxide ($Al_2O_3$). Consequently, each of the first and second inorganic encapsulation layers 142 and 146 is deposited in a low-temperature atmosphere, whereby it is possible to prevent damage to the light-emitting stack 124, which has low resistance to a high-temperature atmosphere, when each of the first and second inorganic encapsulation layers 142 and 146 is deposited.

The organic encapsulation layer 144 reduces stress between the layers due to bending of the organic light-emitting display device and improves planarization. The organic encapsulation layer 144 is formed on the substrate 101 on which the first inorganic encapsulation layer 142 is formed, and is made of a non-photosensitive organic dielectric material, such as a particle cover layer (PCL), an acrylic resin, an epoxy resin, polyimide, polyethylene, or silicon oxycarbide (SiOC), or a photosensitive organic dielectric material, such as photo acrylic. The organic encapsulation layer 144 is disposed in the active area AA, excluding the non-active area NA. To this end, at least one dam 110 is disposed to prevent the organic encapsulation layer 144 from spreading to the non-active area NA. The at least one dam 110 is made of the same material as at least one of the pixel planarization layer 166, the bank 128, or a spacer (not shown). For example, in the case in which three dams 110 are provided, a first dam 1101, which is the most adjacent to the active area AA, is formed by sequentially stacking a second sub dam 110b made of the same material as the bank 128 and a third sub dam 110c made of the same material as the spacer. A third dam 1103, which is the most distant from the active area AA, is formed by sequentially stacking a first sub dam 110a made of the same material as the pixel planarization layer 166 and a second sub dam 110b made of the same material as the bank 128. A second dam 1102, which is disposed between the first and third dams 1101 and 1103, is formed by sequentially stacking a first sub dam 110a made of the same material as the pixel planarization layer 166 and a third sub dam 110c made of the same material as the spacer. Meanwhile, since the organic encapsulation layer 144 is disposed on at least a portion of the first dam 1101, which is the most adjacent to the active area AA, the organic encapsulation layer 144 compensates for a step between each of the pixel planarization layer 166 and the bank 128 and the dam 110. In addition, the area in which the organic encapsulation layer 144 is formed may be defined by only the second and third dams 1102 and 1103 without the first dam 1101, which has the lowest height among the first to third dams 1101, 1102, and 1103.

A plurality of touch electrodes 150 and touch lines 152 are disposed on the encapsulation unit 140.

The touch electrode 150 and the touch line 152 may be formed in the same plane of the active area AA, and are made of the same material. That is, each of the touch electrode 150 and the touch line 152 is disposed as a single layer without a touch buffer film and a touch dielectric film. Consequently, the touch electrode 150 and the touch line 152 may be formed through a one-time mask process, whereby it is possible to simplify the process and to reduce the thickness of a display device having the touch electrode 150 and the touch line 152.

The plurality of touch electrodes 150 are independently formed on the encapsulation unit 140 in the state of being split in first and second directions that intersect each other. The plurality of touch electrodes 150 are formed in an area corresponding to the plurality of subpixels in consideration of user touch area. For example, one touch electrode 150 is formed so as to correspond to an area several times to several hundred times larger than one subpixel.

The touch electrode 150 is formed so as to have a single-layered structure or a multi-layered structure using an opaque metal that exhibits high corrosion resistance, acid resistance, and conductivity, such as Ta, Ti, Cu, or Mo, or is formed so as to have a single-layered structure or a multi-layered structure using an ITO-, IZO-, IZGO-, or ZnO-based transparent conductive film and an opaque metal.

As shown in FIGS. 3 and 4, the touch electrode 150 including the opaque metal is formed in a mesh shape in which the touch electrode does not overlap the light-emitting area of each of the red (R), green (G), and blue (B) subpixels and overlaps the bank 128 disposed between the light-emitting areas. That is, the mesh-shaped touch electrode 150 is formed so as to have a light-emitting opening 165 configured to open the light-emitting area of each of the red (R), green (G), and blue (B) subpixels. In FIG. 3, the light-emitting opening 165 has been described as having a quadrangular structure by way of example. Alternatively, as shown in FIG. 1, the light-emitting opening 165 may have a diamond structure. The light-emitting opening 165 is formed so as to correspond to the shape or size of the light-emitting area of each subpixel.

The mesh-shaped touch electrode 150 exhibits higher conductivity than a transparent conductive film, whereby the touch electrode 150 may be formed as a low-resistance electrode. Consequently, the resistance and capacitance of the touch electrode 150 are reduced, whereby an RC time constant is reduced and thus touch sensitivity is improved. In addition, the mesh-shaped touch electrode 150 overlaps the bank 128 while having a line width equal to or less than the line width of the bank 128, whereby it is possible to prevent reduction in an aperture ratio and transmittance due to the touch electrode 150.

A touch passivation film 168 is disposed on the touch electrode 150. The touch passivation film 168 is formed so as to cover the touch electrode 150, whereby it is possible to prevent damage to the touch electrode 150. In addition, the touch passivation film 168 is formed so as to be removed from the bending area BA such that the position of a neutral surface of the bending area BA is optimized at the time of bending the bending area BA, whereby it is possible to prevent cracks from being formed in the touch lines 152 and the display link lines 154. Here, the neutral surface means an imaginary surface to which no stress is applied as the result of offsetting compressive force and tensile force applied to the bending area BA against each other when the bending area BA is bent. Tensile force is applied to the thin film layer disposed at the upper surface based on the neutral surface, and compressive force is applied to the thin film layer disposed at the lower surface based on the neutral surface. The touch passivation film 168 is made of an organic insulative material, such as epoxy or acrylic, and is formed in the shape of a thin film or a film, is made of an inorganic insulative material, such as SiNx or SiOx, or is formed of a polarizing film.

The plurality of touch lines 152 is disposed in the active area AA at at least one of one side or the other side of each of the touch electrodes 150. The touch line 152 extends from the touch electrode 150 in the active area AA, and is electrically connected to the touch pad 170 disposed in the pad area PA of the non-active area NA.

In addition, the data link line 154 disposed in the non-active area NA together with the touch line 152 and extends from the display line in the active area AA, and is electrically connected to the display pad 180 disposed in the pad area PA of the non-active area NA.

The display pad 180 and the touch pad 170 disposed in the pad area PA are disposed at different rows, as shown in FIGS. 1 and 3. For example, as shown in FIG. 3, the touch pads 170 are disposed at a first row, which is the closest to (the farthest from) the active area AA, and the display pads 180 are disposed at second to fourth rows, which are far from (close to) the active area AA.

In the case in which the touch pads 170 are disposed at the first row, which is the closest to the active area AA, a plurality of display link lines 154 is disposed between the touch pads 170 disposed at the first row. In addition, display link lines 154 connected to the display pads 180 disposed at the fourth row are disposed between the display pads 180 disposed at the second and third rows. In the case in which the touch pads 170 are disposed at the fourth row, which is the farthest from the active area AA, touch lines 152 connected to the touch pads 170 are disposed between the display pads 180 disposed at the first to third rows.

In an embodiment in which the touch pad 170 and the display pad 180 are disposed at a plurality of rows, it is possible to reduce the length of the area occupied by the touch pad 170 and the display pad 180 in the pad area PA, compared to a comparative example in which the touch pad 170 and the display pad 180 are disposed in a line. That is, the length of the area occupied by the touch pad 170 and the display pad 180 disposed at the plurality of rows in the pad area PA is less than the length of the signal transmission film 202 on which the integrated touch display drive IC (TDDI) connected to the touch pad 170 and the display pad 180 is mounted. As a result, all of the touch pads 170 and the display pads 180 may contact signal terminals of the integrated touch display drive IC (TDDI) one to one. In addition, the touch pad 170 and the display pad 180 are freely disposed at the plurality of rows in a limited space, whereby it is possible to prevent electrical short circuit between the touch pads 170, electrical short circuit between the display pads 180, electrical short circuit between the touch pad 170 and the display pad 180, and electrical short circuit between the signal terminals.

The touch line 152 electrically connected to the touch pad 170 is disposed in the first link area LA1, the bending area BA, and the second link area LA2. The touch line 152 includes first to third touch lines 152a, 152b, and 152c, which are disposed in different areas and made of different materials.

The first touch line 152a extends from the touch electrode 150, and is disposed in the active area AA and the first link area LA1. The first touch line 152a is made of the same material as the touch electrode 150, and is formed through the same mask process as the touch electrode 150. The first touch line 152a is formed so as to have a single-layered structure or a multi-layered structure using an opaque metal that exhibits high corrosion resistance, acid resistance, and conductivity, such as Al, Ta, Ti, Cu, or Mo. For example, the first touch line 152a is formed of Ti/Al/Ti.

The second touch line 152b is electrically connected to the first touch line 152a exposed through a first touch contact hole 158a formed through a crack prevention layer 148. The second touch line 152b is disposed in the bending area BA, and is formed through the same mask process as the source and drain electrodes 136 and 138 using the same material as the source and drain electrodes 136 and 138. In particular, since the second touch line 152b is formed so as to be longer than the first and third touch lines 152a and 152c, as shown in FIG. 4, the second touch line 152b is made of a metal that has lower resistance than the first and third touch lines 152a and 152c.

The third touch line 152c is electrically connected to the second touch line 152b exposed through a second touch contact hole 158b formed through the upper interlayer dielectric film 118. The third touch line 152c is disposed in the second link area LA2, and is formed through the same mask process using the same material as one of the gate electrode 132 and the third storage electrode 106.

The touch line 152 including the first to third touch lines 152a, 152b, and 152c is electrically connected to the touch pad 170 disposed in the pad area PA. The touch pad 170 is formed so as to be exposed by the touch passivation film 168. The touch pad 170 includes first to third touch pad electrodes 172, 174, and 176.

Since the first touch pad electrode 172 extends from the third touch line 152c, the first touch pad electrode 172 is made of the same material as the third touch line 152c, and is disposed on the lower interlayer dielectric film 116.

The second touch pad electrode 174 is made of the same material as the second touch line 152b, and is disposed on the upper interlayer dielectric film 118. The second touch pad electrode 174 is electrically connected to the first touch pad electrode 172 exposed through a touch pad contact hole 178 formed through the upper interlayer dielectric film 118.

The third touch pad electrode 176 is electrically connected to the second touch pad electrode 174 exposed by the crack prevention layer 148. The third touch pad electrode 176 is disposed on a portion of the upper surface of the crack prevention layer 148, the side surface of the crack prevention layer 148, and the second touch pad electrode 174. The third touch pad electrode 176 is disposed as a single layer without a touch buffer film and a touch dielectric film together with the touch electrode 150 and the touch line 152. Consequently, the third touch pad electrode 176 may be formed through a one-time mask process together with the touch electrode 150 and the touch line 152, whereby the process is simplified.

Figure 6:
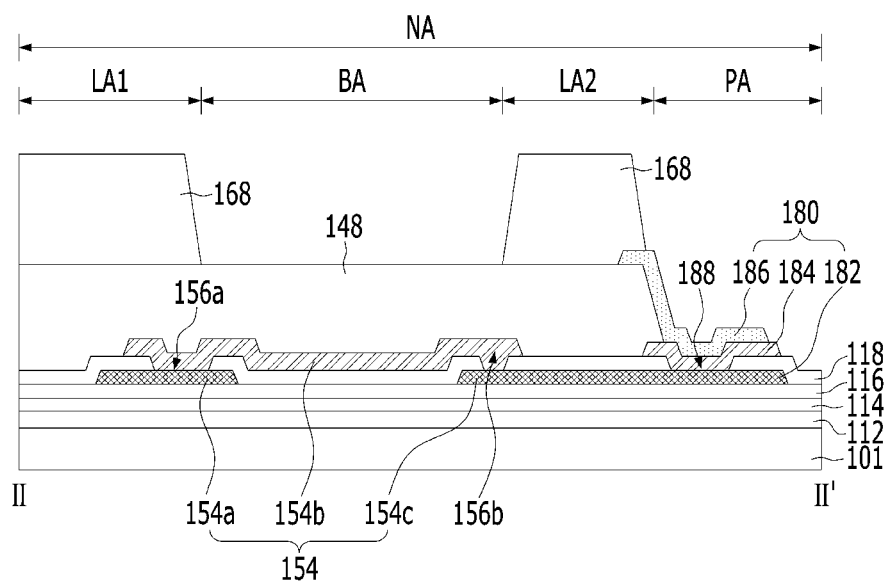
FIG. 6 is a sectional view of the display device taken along line II-II' of FIG. 3, according to an embodiment of the present disclosure.

As shown in FIG. 6, the display link line 154 and the display pad 180 are disposed in the non-active area NA together with the touch pad 170 and the touch line 152.

As shown in FIG. 6, the display link line 154 is electrically connected to the display pad 180 disposed in the pad area PA via the first link area LA1, the bending area BA, and the second link area LA2.

The display link line 154 includes first to third display link lines 154a, 154b, and 154c disposed in different areas.

The first display link line 154a extends from the display line disposed in the active area AA (e.g. the data line DL, the scan line SL, and a power supply line VL), and is disposed in the first link area LA1. The first display link line 154a is formed through the same mask process using the same material as at least one of the gate electrode 132 or the third storage electrode 106. In the case in which the first display link line 154a is formed through the same mask process using the same material as the third storage electrode 106, as shown in FIG. 6, the first display link line 154a is exposed through a first link contact hole 156a formed through the upper interlayer dielectric film 118, and is electrically connected to the second display link line 154b. In the case in which the first display link line 154a is formed through the same mask process using the same material as the gate electrode 132, the first display link line 154a is exposed through a first link contact hole 156a formed through the lower and upper interlayer dielectric films 116 and 118, and is electrically connected to the second display link line 154b.

The second display link line 154b is disposed in the bending area BA so as to electrically connect the first and third display link lines 154a and 154c to each other. The second display link line 154b is electrically connected to the first display link line 154a exposed through the first link contact hole 156a formed through the upper interlayer dielectric film 118 or the lower and upper interlayer dielectric films 116 and 118. The second display link line 154b is formed through the same mask process as the source and drain electrodes 136 and 138 using the same material as the source and drain electrodes 136 and 138. In particular, since the second display link line 154*b* is formed so as to be longer than the first and third display link lines 154*a* and 154*c*, as shown in FIG. 6, the second display link line 154*b* is made of a metal that has lower resistance than the first and third display link lines 154*a* and 154*c*.

The third display link line 154*c* is disposed in the second link area LA2 so as to electrically connect the second display link line 154*b* and the touch pad 170 to each other. The third display link line 154 is exposed through a second link contact hole 156*b* formed through the upper interlayer dielectric film 118 or the lower and upper interlayer dielectric films 116 and 118, and is electrically connected to the second display link line 154*b*. The third display link line 154*c* is formed through the same mask process using the same material as at least one of the gate electrode 132 or the third storage electrode 106. In the case in which the third display link line 154*c* is formed through the same mask process using the same material as the third storage electrode 106, as shown in FIG. 6, the third display link line 154*c* is exposed through a second link contact hole 156*b* formed through the upper interlayer dielectric film 118, and is electrically connected to the second display link line 154*b*. In the case in which the third display link line 154*c* is formed through the same mask process using the same material as the gate electrode 132, the third display link line 154*c* is exposed through a second link contact hole 156*b* formed through the lower and upper interlayer dielectric films 116 and 118, and is electrically connected to the second display link line 154*b*.

The display link line 154 including the first to third display link lines 154*a*, 154*b*, and 154*c* is electrically connected to the display pad 180 disposed in the pad area PA.

Since the display pad 180 is formed so as to have the same stack structure in the same plane as the touch pad 170, the heights of the uppermost surfaces of the touch pad 170 and the display pad 180 are equal to each other. Consequently, the single transmission film 202 that contacts the touch pad 170 and the display pad 180 may be attached to the touch pad 170 and the display pad 180 under the same pressure, whereby the process of attaching the single transmission film 202 is simplified.

The display pad 180 includes first to third display pad electrodes 182, 184, and 186.

Since the first display pad electrode 182 extends from the third display link line 154*c*, the first display pad electrode 182 is made of the same material as the third display link line 154*c*, and is disposed on the lower interlayer dielectric film 116.

The second display pad electrode 184 is made of the same material as the second display link line 154*b*, and is disposed on the upper interlayer dielectric film 118. The second display pad electrode 184 is electrically connected to the first display pad electrode 182 exposed through a display pad contact hole 188 formed through the upper interlayer dielectric film 118.

The third display pad electrode 186 is made of the same material as the touch electrode 150, and is electrically connected to the second display pad electrode 184 exposed by the crack prevention layer 148. The third display pad electrode 186 is disposed on a portion of the upper surface of the crack prevention layer 148, the side surface of the crack prevention layer 148, and the second display pad electrode 184.

The touch line 152 disposed in the first and second link areas LA1 and LA2 of the non-active area NA is alternately disposed with the plurality of display link lines 154 in the non-active area NA. In FIG. 3, the structure in which one touch line 152 and two display link lines 154 are alternately disposed has been described by way of example. However, the present invention is not limited thereto. That is, a minimum of N (N being a natural number greater than 1) display link lines 154 and a minimum of M (M being a natural number greater than 1 and less than N) touch lines 152 are alternately disposed, whereby a minimum of M touch lines 152 is disposed with respect to a minimum of N display link lines.

Figure 7:
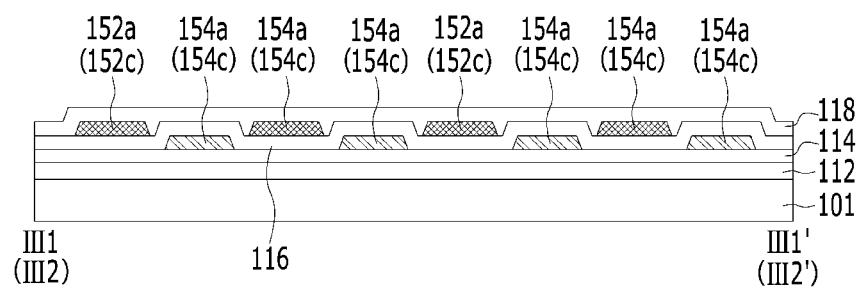
FIG. 7 is a sectional view of the display device taken along lines III1-III1' and III2-III2' of FIG. 3, according to an embodiment of the present disclosure.

At this time, outer signal lines including the display link lines 154 and the touch lines 152 disposed in the second link area LA2 are alternately disposed on different layers, as shown in FIG. 7. That is, the first display link lines 154*a* that are adjacent to each other are alternately disposed on different layers, and the first display link line 154*a* and the first touch line 152*a* that are adjacent to each other are alternately disposed on different layers. In addition, the third display link lines 154*c* that are adjacent to each other are alternately disposed on different layers, and the third display link line 154*c* and the third touch line 152*c* that are adjacent to each other are alternately disposed on different layers.

Specifically, a first display link line 154*a* is disposed on a different layer from another first display link line 154*a* and a first touch line 152*a* adjacent thereto. For example, an odd (even)-number-th first display link line 154*a* is made of the same material as the gate electrode 132, and is disposed on the gate dielectric film 114, which is the same plane as the gate electrode 132. In addition, an even (odd)-number-th first display link line 154*a* or first touch line 152*a* is made of the same material as the fourth storage electrode 108, and is disposed on the lower interlayer dielectric film 116, which is the same plane as the fourth storage electrode 108.

A third display link line 154*c* is also disposed on a different layer from another third display link line 154*c* and a third touch line 152*c* adjacent thereto. For example, an odd (even)-number-th third display link line 154*c* is made of the same material as the gate electrode 132, and is disposed on the gate dielectric film 114, which is the same plane as the gate electrode 132. In addition, an even (odd)-number-th third display link line 154*c* or third touch line 152*c* is made of the same material as the fourth storage electrode 108, and is disposed on the lower interlayer dielectric film 116, which is the same plane as the fourth storage electrode 108.

The outer signal lines including the display link lines 154 and the touch lines 152 are alternately disposed on different layers, as shown in FIG. 7. That is, an outer signal line disposed at the upper side (the lower side) is disposed between outer signal lines disposed at the lower side (the upper side). At this time, the difference between the line width of the outer signal line disposed at the upper side (the lower side) and the distance between the outer signal lines disposed at the lower side (the upper side) is a maximum of 0.2 µm.

Even when the distance between the outer signal lines 152 and 154 disposed in the first and second link areas LA1 and LA2 is reduced, therefore, it is possible to prevent electrical short circuit between the outer signal lines. In the present disclosure, therefore, it is possible to reduce the distance between the outer signal lines and thus to realize a narrow bezel.

Meanwhile, as shown in FIG. 4, the crack prevention layer 148 is disposed in the bending area BA.

The crack prevention layer 148 is disposed so as to cover the touch line 152 and the display link line 154 disposed on the same layer in the bezel area BA. For example, the crack prevention layer 148 is disposed on the second touch line 152b and the second display link line 154b disposed in the bezel area BA on the upper interlayer dielectric film. The crack prevention layer 148 is made of an organic film material that exhibits higher strain and impact resistance than an inorganic film. For example, since the crack prevention layer 148 is formed together with at least one of the pixel planarization layer 166 or the bank 128, the crack prevention layer 148 is made of the same material as at least one of the pixel planarization layer 166 or the bank 128, and is disposed in the same plane as at least one of the pixel planarization layer 166 or the bank 128. Since the crack prevention layer 148 made of the organic film material has higher strain than an inorganic film material, bending stress generated when the substrate 101 is bent is reduced. Consequently, it is possible for the crack prevention layer 148 to prevent cracks from being formed in the bending area BA, thereby preventing cracks from spreading to the active area AA.

Figure 8:
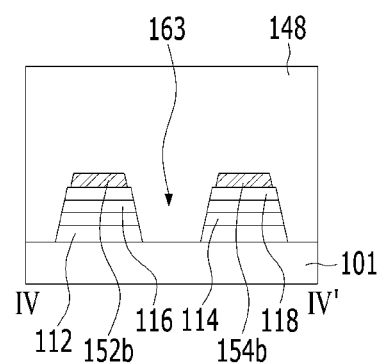
FIG. 8 is a sectional view of the display device taken along line IV-IV' of FIG. 3, according to an embodiment of the present disclosure.

In addition, as shown in FIG. 8, a bending opening 162 is disposed in the bending area BA.

The bending opening 163 is formed by removing inorganic films that exhibit higher hardness than an organic film and thus easily crack due to bending stress. The bending opening 163 exposes the substrate 101 by removing an inorganic film disposed between the second touch line 152b and the second display link line 154b and between the second display link lines 154b disposed in the bending area BA. For example, the bending opening 163 is formed through the buffer layer 112, the gate dielectric film 114, and the upper and lower interlayer dielectric films 116 and 118 disposed between the second touch line 152b and the second display link line 154b and between the second display link lines 154b so as to expose the substrate 101.

In the present disclosure, as described above, it is possible to prevent cracks from being generated due to the bending opening 163 and the crack prevention layer 148 disposed in the bending area BA. In the present disclosure, therefore, it is possible to prevent cracks generated by impact from spreading to the active area AA, thereby preventing occurrence of line defects and element driving defects.

Figure 9:
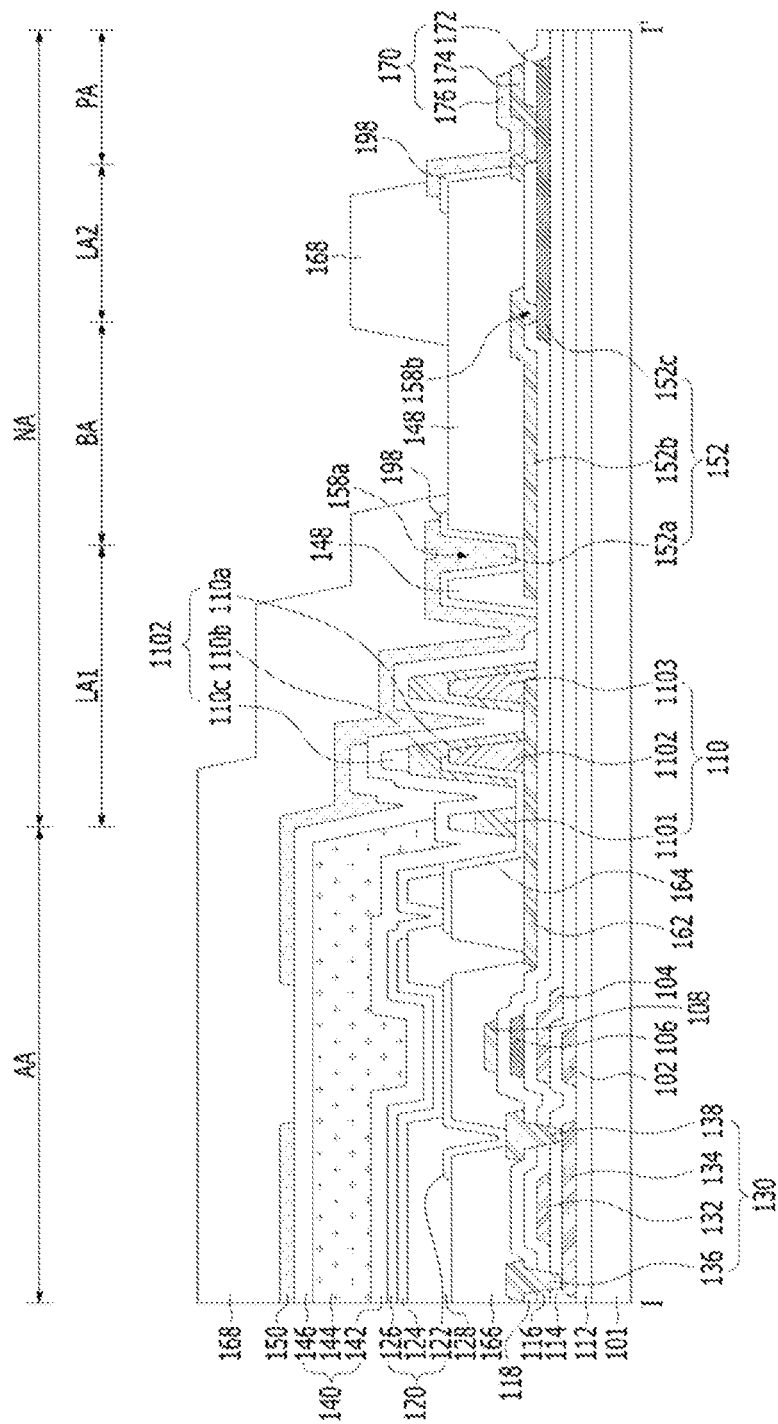
FIG. 9 is a sectional view showing a display device according to a second embodiment of the present disclosure.

FIG. 9 is a sectional view showing a display device according to a second embodiment of the present disclosure.

The display device shown in FIG. 9 includes the same components as the display device shown in FIG. 4 except that an adhesive reinforcement layer 198 is further included. Consequently, a detailed description of the same components will be omitted.

The adhesive reinforcement layer 198 is disposed between the crack prevention layer 148 and each of the touch line 152, the third touch pad electrode 176, and the third display pad electrode 186. The adhesive reinforcement layer 198 is formed so as to include indium having high adhesive strength with a conductive layer (e.g. Ti) included in each of the touch line 152, the third touch pad electrode 176, and the third display pad electrode 186 and an organic film included in the crack prevention layer 148. For example, the adhesive reinforcement layer 198 may be made of the same material as the anode 122, including an IZO- or IGZO-based material, and is formed through the same mask process as the anode 122.

Hereinafter, the embodiment including the adhesive reinforcement layer 198 and a comparative example not including the adhesive reinforcement layer 198 will be described based on comparison therebetween.

In the comparative example, since the adhesive reinforcement layer 198 is not included, each of the touch line 152, the third touch pad electrode 176, and the third display pad electrode 186 directly contacts the crack prevention layer 148. In this case, the touch line 152, the third touch pad electrode 176, and the third display pad electrode 186 are formed on the crack prevention layer 148, and then the touch passivation film 168 is formed in subsequent processes. Each of the touch line 152, the third touch pad electrode 176, and the third display pad electrode 186, which has low interface adhesive strength with the crack prevention layer 148, is separated from the crack prevention layer 148 due to impact generated in a plurality of manufacturing processes (for example, a high-temperature process) performed to form the touch passivation film 168. In this case, it is not possible to properly transmit a signal supplied through the touch line 152, the third touch pad electrode 176, and the third display pad electrode 186.

In the embodiment, the adhesive reinforcement layer 198 is formed on the crack prevention layer 148, and then the touch line 152, the third touch pad electrode 176, and the third display pad electrode 186 are formed. In this case, the adhesive reinforcement layer 198 not only has high interface adhesive strength with each of the touch line 152, the third touch pad electrode 176, and the third display pad electrode 186 but also has high interface adhesive strength with the crack prevention layer 148. Consequently, it is possible to prevent separation of each the touch line 152, the third touch pad electrode 176, and the third display pad electrode 186 from the crack prevention layer 148 even when impact is generated in a plurality of manufacturing processes performed to form the touch passivation film 168.

Meanwhile, the touch passivation film 168, which is made of an organic film, has low interface adhesive strength with each of the touch line 152, the third touch pad electrode 176, and the third display pad electrode 186. However, no subsequent manufacturing process is performed after the touch passivation film 168 is formed, and therefore it is possible to reduce separation of the touch passivation film 168 from each the touch line 152, the third touch pad electrode 176, and the third display pad electrode 186. In addition, even when the touch passivation film 168 is separated from each of the touch line 152, the third touch pad electrode 176, and the third display pad electrode 186, a signal is properly supplied through the touch line 152, the third touch pad electrode 176, and the third display pad electrode 186.

Furthermore, in the case in which there is a subsequent manufacturing process after the touch passivation film 168 is formed, the adhesive reinforcement layer 198 may be disposed between the touch passivation film 168 and each of the touch line 152, the third touch pad electrode 176, and the third display pad electrode 186.

In the present disclosure, as described above, the adhesive reinforcement layer 198 is included, and therefore it is possible to prevent separation between the crack prevention layer 148 and each of the touch line 152, the third touch pad electrode 176, and the third display pad electrode 186, thereby improving product yield.

Figure 10:
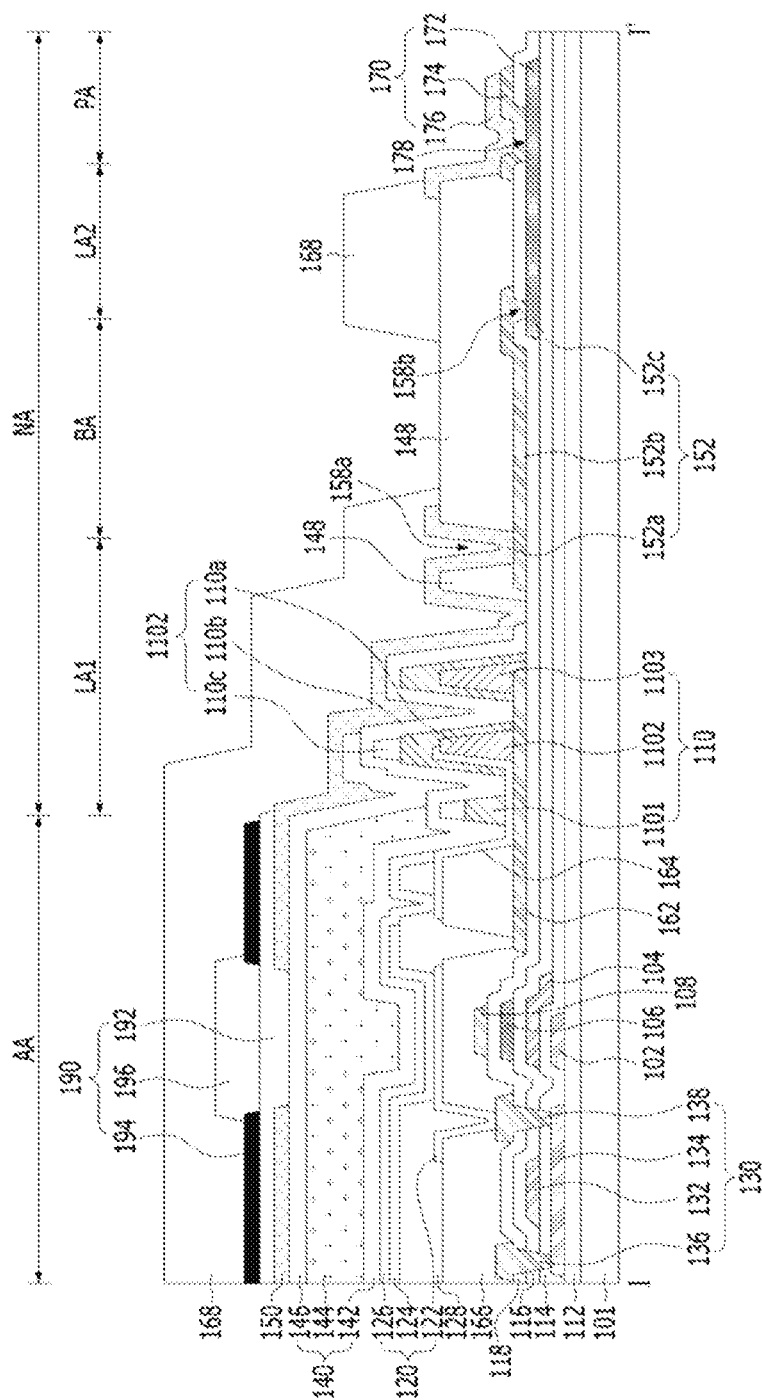
FIG. 10 is a sectional view showing a display device according to a third embodiment of the present disclosure.

FIG. 10 is a sectional view showing an organic light-emitting display device having a touch sensor according to a third embodiment of the present disclosure.

The organic light-emitting display device having the touch sensor shown in FIG. 10 includes the same components as the organic light-emitting display device shown in FIG. 4 except that a color filter array 190 is further included. Consequently, a detailed description of the same components will be omitted.

The color filter array 190 includes a color filter 196, a black matrix 194, and a touch planarization film 192 disposed on the encapsulation unit 140.

The color filter 196 is disposed so as to overlap each of the subpixels R, G, and B. In the case in which the light-emitting layer included in the light-emitting stack 124 emits white light, the color filter 196 is disposed on the encapsulation unit 140. In the case in which the light-emitting layer included in the light-emitting stack 124 emits red, green, or blue light corresponding to each subpixel, the color filter 196 may be omitted from the display device.

The black matrix 194 is disposed between the color filters 196 so as to overlap the bank 128. The black matrix 194 serves to partition the subpixel areas and to prevent optical interference and backlight bleeding between adjacent subpixel areas. The black matrix 194 is made of a high-resistance black insulative material, or is formed by stacking at least two of a red (R) color filter 196, a green (G) color filter 196, or a blue (B) color filter 196.

The touch planarization film 192 is disposed under the color filter 196 to planarize the substrate 101 on which the touch electrode 150 is formed, or is disposed on the color filter 196 to planarize the substrate 101 on which the color filter 196 and the black matrix 194 are formed.

As described above, at least one of the color filter 196 or the black matrix 194 included in the color filter array 190 is disposed on the touch electrode 150 or is disposed under the touch electrode 150, i.e. between the touch electrode 150 and the encapsulation unit 140.

In the case in which the color filter array 190 is disposed on the touch electrode 150, the color filter 196 and the black matrix 194 of the color filter array 190 absorb external light. Consequently, it is possible to prevent external light from being reflected by the touch electrode 150, thereby preventing a reduction in visibility.

In the case in which the color filter array 190 is disposed between the touch electrode 150 and the encapsulation unit 140, the distance between the touch electrode 150 and the light-emitting element 120 is increased by the color filter array 190. Consequently, it is possible to reduce the value of capacitance of a parasitic capacitor formed between the touch electrode 150 and the light-emitting element 120, thereby preventing a mutual effect due to coupling between the touch electrode 150 and the light-emitting element 120.

Meanwhile, in FIG. 10, the structure in which the color filter 196 and the black matrix 194 contact each other has been described by way of example; however, the color filter 196 and the black matrix 194 may be disposed so as to be spaced apart from each other. For example, the color filter 196 may be disposed between the encapsulation unit 140 and the touch electrode 150, and the black matrix 194 may be disposed on the touch electrode 150.

Also, in the present disclosure, the self-capacitance touch electrode structure has been described by way of example. However, the present disclosure may be applied to a capacitive touch electrode structure.

Furthermore, in the present disclosure, the display device having the bending area BA has been described by way of example. However, the present disclosure may be applied to a display device having no bending area.

As is apparent from the above description, in the present disclosure, it is possible to reduce the distance between the display link lines and the distance between the display link line and the touch line, thereby realizing a narrow bezel.

Also, in the present disclosure, the signal pads including the display pads and the touch pads disposed in the pad area are disposed at a plurality of rows in the pad area, whereby it is possible to prevent electrical short circuit between the signal pads.

Furthermore, in the present disclosure, the adhesive reinforcement layer is provided between the crack prevention layer, which is made of an organic film material, and the display link line, which is made of a conductive material, whereby it is possible to prevent separation of the crack prevention layer from the display link line.

The above description merely illustrates the present disclosure, and it will be apparent to those skilled in the art that various modifications and variations can be made in the present disclosure without departing from the technical idea of the present disclosure. Therefore, the embodiments disclosed in the specification of the present disclosure do not limit the present disclosure. The scope of the present disclosure should be interpreted by the following claims, and all technical concepts included in a range equivalent thereto should be interpreted as falling within the scope of the present disclosure.

What is claimed is:

1. A display device comprising:
    a light-emitting element disposed in an active area of a substrate;
    an encapsulation unit disposed on the light-emitting element;
    a plurality of touch electrodes disposed on the encapsulation unit;
    a plurality of display link lines electrically connected to the light-emitting element, the display link lines being disposed in a non-active area of the substrate; and
    a plurality of touch lines electrically connected to the plurality of touch electrodes,
    wherein
    at least one of the touch lines is disposed between the display link lines disposed in the non-active area, and
    wherein the at least one of the touch lines and at least one of the display link lines are disposed on different layers in a portion of the non-active area.

2. The display device according to claim 1, further comprising:
    touch pads connected to the plurality of touch lines; and
    display pads connected to the plurality of display link lines.

3. The display device according to claim 2, wherein the non-active area comprises:
    a pad area in which the touch pads and the display pads are disposed;
    a first link area adjacent to the active area;
    a second link area disposed between the first link area and the pad area; and
    a bending area disposed between the first link area and the second link area.

4. The display device according to claim 3, wherein each of outer signal lines comprising at least one of the display link lines and at least one of the touch lines are disposed on a different layer in the second link area and the first link area, and
    the at least one of the touch lines and the at least one of the display link lines are disposed on a same layer in the bending area.

5. The display device according to claim 3, wherein the touch lines are made of different materials and disposed on different layers in the first link area, the bending area, and the second link area.

6. The display device according to claim 5, further comprising:
a transistor connected to the light-emitting element, wherein
the touch lines comprise:
first touch lines disposed in the first link area, the first touch lines being formed of a same material as the touch electrodes;
second touch lines disposed in the bending area, the second touch lines being formed of a same material as source and drain electrodes of the transistor; and
third touch lines disposed in the second link area, the third touch lines being disposed at a lower layer than the second touch lines.

7. The display device according to claim 2, wherein
the touch pads and the display pads are disposed at different rows, and
the display link lines are disposed between the touch pads, or the touch lines are disposed between the display pads.

8. The display device according to claim 3, further comprising:
a crack prevention layer disposed in the bending area, the crack prevention layer being disposed on the touch lines and the display link lines; and
an adhesive reinforcement layer disposed between each of the touch lines and the display link lines and the crack prevention layer, the adhesive reinforcement layer being made of a material comprising indium.

9. The display device according to claim 8, wherein the adhesive reinforcement layer is formed of a same material as an anode of the light-emitting element.

10. The display device according to claim 1, further comprising a color filter disposed above or under each of the touch electrodes.

11. A display device comprising:
a light-emitting element disposed in an active area of a substrate;
an encapsulation unit disposed on the light-emitting element;
a plurality of touch electrodes disposed on the encapsulation unit;
display link lines electrically connected to the light-emitting element, the display link lines being disposed in a non-active area of the substrate;
a crack prevention layer disposed in a bending area, which is a portion of the non-active area, the crack prevention layer being disposed on the touch lines and the display link lines;
an adhesive reinforcement layer disposed between each of the touch lines and the display link lines and the crack prevention layer, the adhesive reinforcement layer being formed of a material comprising indium; and
a plurality of touch lines electrically connected to the plurality of touch electrodes, wherein
at least one of the touch lines is disposed between the display link lines disposed in the bending area, which is a portion of the non-active area.

12. The display device according to claim 11, further comprising:
touch pads connected to the plurality of touch lines; and
display pads connected to the plurality of display link lines.

13. The display device according to claim 12, wherein the non-active area comprises:
the bending area;
a pad area in which the touch pads and the display pads are disposed;
a first link area disposed between the active area and the bending area; and
a second link area disposed between the first link area and the pad area.

14. The display device according to claim 13, wherein each of outer signal lines comprising at least one of the display link lines and at least one of the touch lines are disposed on a different layer in the second link area and the first link area, and
the at least one of the touch lines and the at least one of the display link lines are disposed on a same layer in the bending area.

15. The display device according to claim 12, wherein
the touch pads and the display pads are disposed at different rows, and
the display link lines are disposed between the touch pads, or the touch lines are disposed between the display pads.

16. The display device according to claim 11, further comprising a color filter disposed above or under each of the touch electrodes.

17. The display device according to claim 1, wherein a minimum of M touch lines (M being a natural number greater than 1 and less than N) is disposed with respect to a minimum of N display link lines (N being a natural number greater than 1), among the plurality of display link lines, in the non-active area.

18. The display device according to claim 11, wherein a minimum of M touch lines (M being a natural number greater than 1 and less than N) is disposed with respect to a minimum of N display link lines (N being a natural number greater than 1), among the plurality of display link lines, in the non-active area.

* * * * *